United States Patent
Ogiwara et al.

[19]

[11] Patent Number: 6,111,777
[45] Date of Patent: Aug. 29, 2000

[54] FERROELECTRIC MEMORY

[75] Inventors: Ryu Ogiwara, Kamakura; Sumio Tanaka, Tokyo, both of Japan

[73] Assignee: Kabushiki Kaisha Toshiba, Kawasaki, Japan

[21] Appl. No.: 09/401,663

[22] Filed: Sep. 23, 1999

[30] Foreign Application Priority Data

Oct. 8, 1998 [JP] Japan ................................. 10-286739

[51] Int. Cl.$^7$ ................................................. G11C 11/22
[52] U.S. Cl. .......................................... 365/145; 365/210
[58] Field of Search ................................. 365/145, 210, 365/149, 150

[56] References Cited

U.S. PATENT DOCUMENTS

| | | | |
|---|---|---|---|
| 5,572,459 | 11/1996 | Wilson et al. ........................... | 365/145 |
| 5,694,353 | 12/1997 | Koike ...................................... | 365/145 |
| 5,822,237 | 10/1998 | Wilson et al. ........................... | 365/145 |
| 5,898,608 | 4/1999 | Hirano et al. ............................ | 365/210 |
| 5,910,911 | 6/1999 | Sekiguchi et al. ....................... | 365/145 |
| 5,926,413 | 7/1999 | Yamada et al. .......................... | 365/145 |
| 5,959,922 | 9/1999 | Jung ........................................ | 365/210 |
| 6,026,009 | 2/2000 | Choi et al. ............................... | 365/145 |

FOREIGN PATENT DOCUMENTS 9-97496 12/1997 Japan .

*Primary Examiner*—Son T. Dinh
*Assistant Examiner*—Anh Phung
*Attorney, Agent, or Firm*—Banner & Witcoff, Ltd.

[57] ABSTRACT

A dummy cell is provided in every column and consists of a dummy capacitor and two transistors. When the charge of the ferroelectric capacitor is released to one of a bit line pair, a first dummy word line is selected and charge of the dummy capacitor is released to the other of the bit line pair by way of one of the two transistors. When the charge of the ferroelectric capacitor is released to the other of the bit line pair, a second dummy word line is selected and the charge of the dummy capacitor is released to one of the bit line pair by way of the other one of the two transistors. When either one of the first and second dummy word lines is selected the dummy plate driver supplies a clock signal to the dummy capacitor.

7 Claims, 12 Drawing Sheets

$V_{PL}$: POTENTIAL OF PLATE LINE
$V_{BL}$: POTENTIAL OF BIT LINE

FERROELECTRIC MEMORY

BACKGROUND OF THE INVENTION

The present invention relates to a ferroelectric memory.

The ferroelectric memory is a novel memory which has been recently gained attention due to several advantageous features such as non-volatile memory, high-speed operation, a large number of write/erase cycles, and low power consumption.

Hitherto, several types of ferroelectric memories are known. Of them, studies have been aggressively made on a ferroelectric memory constituted of 1T/1C type memory cells each consisting of a single transistor and a single capacitor.

FIG. 1 shows a 1T/1C type memory cell of the ferroelectric memory.

As is apparent from the figure, the memory cell bears a striking resemblance to a dynamic random access memory (DRAM). The memory cell differs from the DRAM in the following points. First, a cell capacitor is formed of a ferroelectric capacitor. Second, an end of the cell capacitor is not connected to a line supplying a fixed potential (ground potential GND, a half of a power source potential: VCC) but connected to a plate line such that a potential can be set independently in every memory cell.

In the ferroelectric memory, data program and data read operations are performed by use of hysteresis characteristics of the ferroelectric material constituting the ferroelectric capacitor.

FIG. 2 shows the hysteresis characteristics of the ferroelectric capacitor.

Data of the memory cell are recognized by the polarization direction of the ferroelectric capacitor. In FIG. 2, a voltage to be applied to the ferroelectric capacitor is defined as follows. If the potential of a bit line BL is higher than that of a plate line PL, the voltage is regarded as a "minus voltage". On the other hand, if the potential of the plate line PL is higher than that of the bit line BL, the voltage is regarded as a "plus voltage". Furthermore, a residual polarization point c corresponds to data "0" and a residual polarization point a corresponds to data "1".

When the data "0" is programmed (input) into a memory cell, a transfer gate is turned on, and then, a voltage (0V) is applied to the bit line BL and a plus potential (voltage) is applied to the plate line PL. Thereafter, when the potential to be applied to the plate line PL is changed to 0V, the polarization point moves from a point b to a point c, with the result that data "0" is programmed (input) into the memory cell.

Similarly, when data "1" is programmed into a memory cell, the transfer gate is turned on, and then, a plus potential is applied to the bit line BL and the voltage "0V" is applied to the plate line PL. Thereafter, when the potential to be applied to the bit line BL is changed to 0V, the polarization point moves from a point d to a point a, with the result that the data "1" is programmed (input) into the memory cell.

The data read operation is performed by detecting an amount of charge released from the ferroelectric capacitor to the bit line BL when a predetermined potential is applied to the plate line PL. For example, if the bit line BL is set in a floating state, and thereafter, the transfer gate is turned on to apply a plus potential to the plate line PL, charge ($\Delta Q1$ in amount) is released to the bit line BL when the data of the selected memory cell is "1". In contrast, when the data of the selected memory cell is "0", charge ($\Delta Q0$ in amount) is released to the bit line BL.

Thus, the data of the memory cell selected can be determined by detecting the difference in charge amount. As a result, accurate data can be read out of the memory chip.

As a method of determining the data, employed is a method of comparing the potential of the bit line BL connected to the memory cell selected with the potential of the bit line BL connected to a reference cell.

When the potential of the bit line BL is set at V1 by the supply of the charge $\Delta Q1$ and the potential of the bit line BL is set at V0 by the supply of the charge $\Delta Q0$, it is desirable that the potential of the bit line BL connected to a reference cell be set at $(V0+V1)/2$.

The reference cell is selected every time the access operation is repeated. Thus, if the reference cell is formed of a ferroelectric capacitor, polarization fatigue takes place in the ferroelectric capacitor every time the access operation is repeated. As a result, no charge is released from the reference cell.

On the other hand, in the case where the reference cell is formed of a paraelectric capacitor, a relative dielectric constant of the paraelectric capacitor is lower than that of the ferroelectric capacitor, so that the size of the reference cell inevitably increases. Therefore, this case is disadvantageous to high integration.

Up to now, no proposals have not been made for a circuit arrangement of a dummy plate driver useful for high integration of devices.

BRIEF SUMMARY OF THE INVENTION

An object of the present invention is to provide a ferroelectric memory having a reference cell region (in particular, a dummy plate driver) useful in high integration.

To attain the aforementioned object, the ferroelectric memory of the present invention comprises a memory cell consisting of
  a ferroelectric capacitor having a first end and a second end;
  a first transistor having a first node, a second node, and a gate, and the first node being connected to the first end of the ferroelectric capacitor;

a word line connected to the gate of the first transistor;

a plate line connected to the second end of the ferroelectric capacitor;

a bit line pair consisting of a first bit line and a second bit line, either one of the first bit line and the second bit line being connected to the second node of the first transistor;

a plate driver for supplying a plate potential to the plate line;

a dummy cell consisting of
  a dummy capacitor having a first end and a second end,
  a second transistor having a first node, a second node and a gate, the first node being connected to the first end of the dummy capacitor, and
  a third transistor having a first node, a second node and a gate, the first node being connected to the first end of the dummy capacitor;

a first dummy word line connected to the gate of the second transistor;

a second dummy word line connected to the gate of the third transistor;

a dummy plate line connected to the second end of the dummy capacitor; and a dummy plate driver for supplying a dummy plate potential to the dummy plate line.

Furthermore, the second node of the second transistor is connected to the first bit line and the second node of the third transistor is connected to the second bit line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, the ferroelectric memory of the present invention will be explained with reference to the accompanying drawings.

Figure 3:
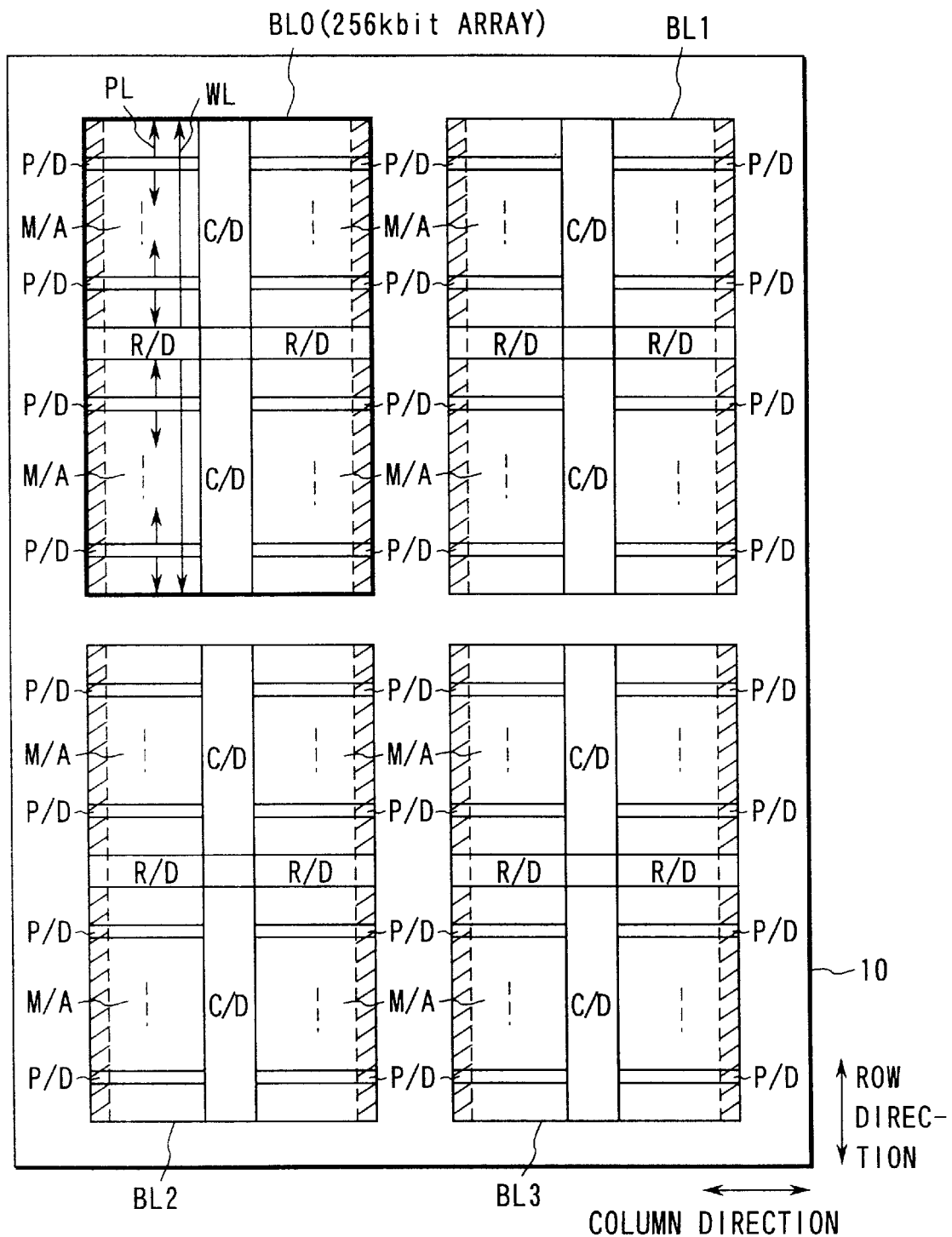
FIG. 3 is a diagram showing a first example of a floor plan of the ferroelectric memory of the present invention.

FIG. 3 shows a first example of a floor plan of the present invention.

A memory chip 10 has a memory cell array region and a peripheral circuit region arranged therein.

The memory cell array region is constituted of four memory blocks BL0 to BL3. Each memory block has a memory capacity of 256 kilo bits. In total, four memory blocks have a memory capacity of 1 mega bit.

Each memory block has a row decoder R/D (including a dummy word line driver), a column decoder C/D, a memory cell array M/A, and a plate driver P/D (including a dummy plate driver). The memory cell array M/A includes a memory cell and a reference cell (hatched portion).

The plate driver P/D is interposed between memory cells of the memory cell array M/A. The plate line PL extends from the plate driver P/D along a row direction of the memory cell array M/A. The word line WL extends from the row decoder R/D toward an edge portion of the memory cell array M/A, in the row direction.

The peripheral circuit region is a region excluding the memory cell array region, which is constituted of a peripheral region along the edge of the memory chip 10 and interval regions between four memory blocks. In the peripheral circuit region, a data input/output circuit, an address buffer circuit, a control circuit, a potential generation circuit, an input/output pad, and the like are formed.

Figure 4:
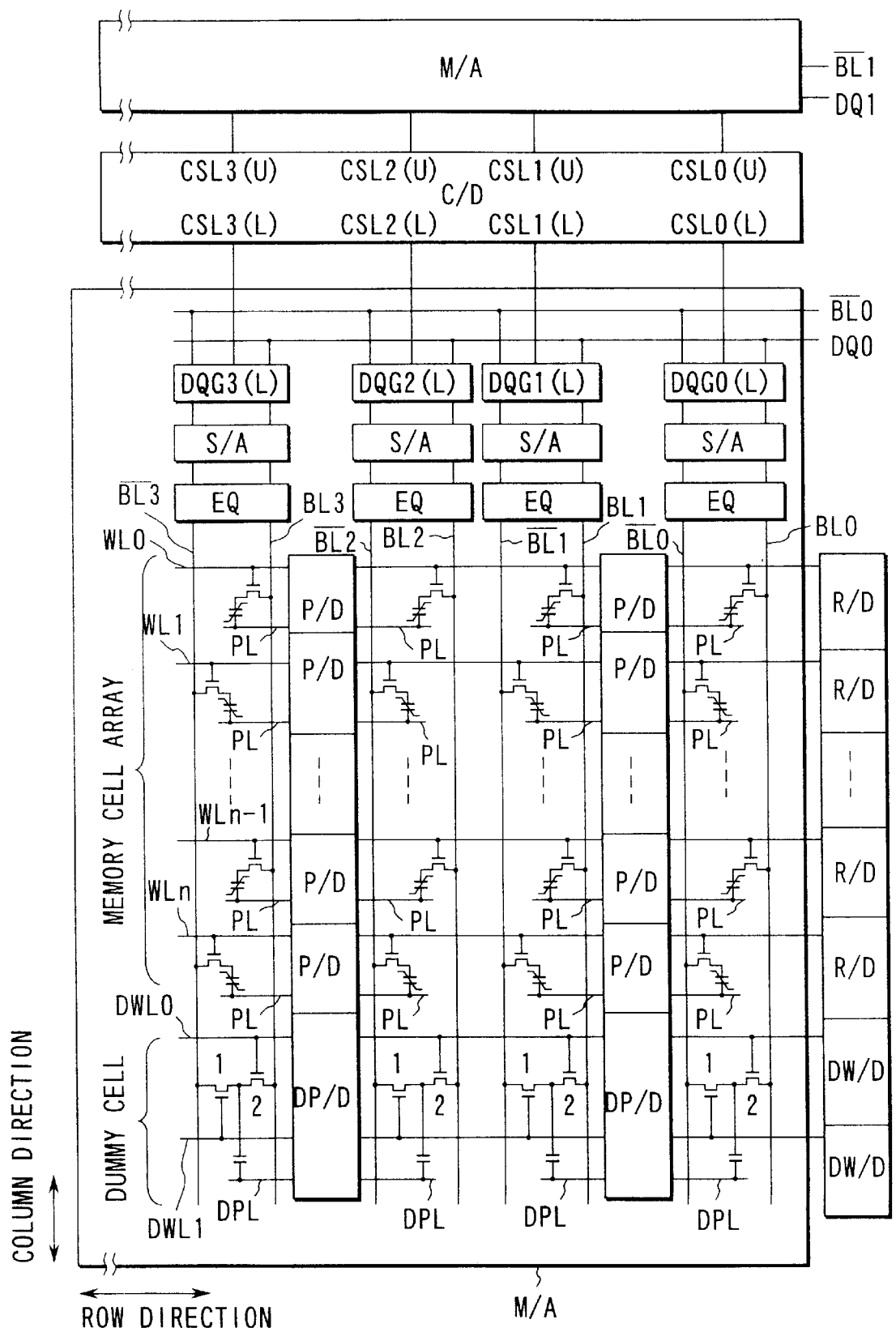
FIG. 4 is a detail view showing the memory cell array of FIG. 3.

FIG. 4 shows the memory cell array M/A of FIG. 3, more specifically.

In the memory cell array, an end of the ferroelectric capacitor (one of two electrodes) is connected to a plate line PL. The plate line PL is connected to a plate driver P/D. The other end of the ferroelectric capacitor (the other electrode) is connected to either one of bit lines BLi, $\overline{BLi}$ via a transfer gate (first transistor).

Word lines WL0 to WLn extend from the row decoder R/D toward an edge portion of the memory cell array, in a row direction. The word lines WL0 to WLn are connected to not only the transfer gate but also the plate driver P/D.

The plate driver P/D monitors potentials of word lines WL0 to WLn at all times and drives the plate lines PL based on the potentials of the word lines WL0 to WLn and ANDed results of a plate clock signals (not shown). Therefore, a plate driver P/D connected to a word line WLj selected drives the plate line PL, however a plate driver P/D connected to a word line WLj not-selected sets a potential of the plate line PL at a ground potential GND.

A dummy cell (reference cell) is provided in every column and constituted of a single dummy capacitor and two transfer gates (second, third transistors). In other words, a single dummy capacitor is disposed per single bit line pair BLi, $\overline{BLi}$. Charge (reference potential) is selectively supplied either one of the bit line pair BLi, $\overline{BLi}$ by the single dummy capacitor.

More specifically, one of two ends (one of two electrodes) of the dummy capacitor is connected to a dummy plate line DPL. The dummy plate line DPL is connected to a dummy plate driver DP/D. The other end of the dummy capacitor is connected to the bit line BLi via a transfer gate ② and simultaneously connected to the bit line $\overline{BLi}$ via a transfer gate ①.

Two dummy word lines DWL0, DWL1 extend toward an edge portion of a memory cell array, in the row direction, from a dummy word line driver DW/D. The dummy word line DWL0 is connected to the gate of the transfer gate ② and simultaneously connected to a dummy plate driver DP/D. Similarly, the dummy word line DWL1 is connected to the gate of the transfer gate ① and simultaneously connected to the dummy plate driver DP/D.

The dummy plate driver DP/D monitors potentials of two dummy word lines DWL0, DWL1 at all times and the potentials of DWL0 and DWL1 are ORed. More specifically, when either one of the dummy word lines DWL0, DWL1 is selected (a high-potential state, namely, "H" state), a dummy plate clock signal is supplied to the dummy plate line DPL.

The bit line pair BLi, $\overline{BLi}$ in the same column are connected to a DQ gate DQGi(L) serving as a column selection switch by way of an equalizing circuit EQ and a sense amplifier S/A. The equalizing circuit EQ plays a role in equalizing potentials of the biLt line pair BLi, $\overline{BLi}$, for example, before a data read-out operation.

The sense amplifier S/A amplifies a potential difference between data read out to the bit line pair BLi, $\overline{BLi}$. The column decoder C/D selects one of a plurality of columns by turning on one of DQ gates DQGi(L). The data of the bit line pair BLi, $\overline{BLi}$ of the column selected are led into a data line pair DQ0, $\overline{DQ0}$ by way of on-state DQGi(L).

In this case, if a word line WLj (j is an even number) is selected, data (charge) of a memory cell is read out to a bit line BLi. At this time, a dummy word line DWL1 is selected and the charge of the reference cell (dummy cell) is released to the bit line $\overline{BLi}$ by way of the transfer gate ①.

In this case, if a word line WLj+1 is selected, data (charge) of a memory cell is read out to a bit line $\overline{BLi}$. At this time, a dummy word line DWL0 is selected and the charge of a reference cell (dummy cell) is released to a bit line BLi by way of the transfer gate ②.

Note that the operation will be explained later more specifically.

The ferroelectric memory is characterized in that a reference cell (dummy cell), which is constituted of a single dummy capacitor and two transfer gates, is provided in every column, in a memory cell array formed of 1T/1C type memory cells. More specifically, a single dummy capacitor is disposed in a single column. Charge is supplied to either one of the bit line pair BLi, $\overline{BLi}$ from the single dummy capacitor.

Therefore, if the dummy capacitor of the reference cell (dummy capacitor) is constituted of a paraelectric capacitor such as an MOS capacitor, the structure of the dummy capacitor should be suitable for attaining high integration.

In the present invention, a single dummy capacitor is disposed per single column, that is, per single bit line pair BLi, $\overline{BLi}$. In addition, a novel structure is employed for the dummy plate driver DP/D).

Now, the circuit arrangement of the plate driver P/D of the memory cell array will be explained briefly, and thereafter, the circuit arrangement of the dummy plate driver DP/D of the dummy cell, which is one of features of the present invention, will be explained.

Figure 5:
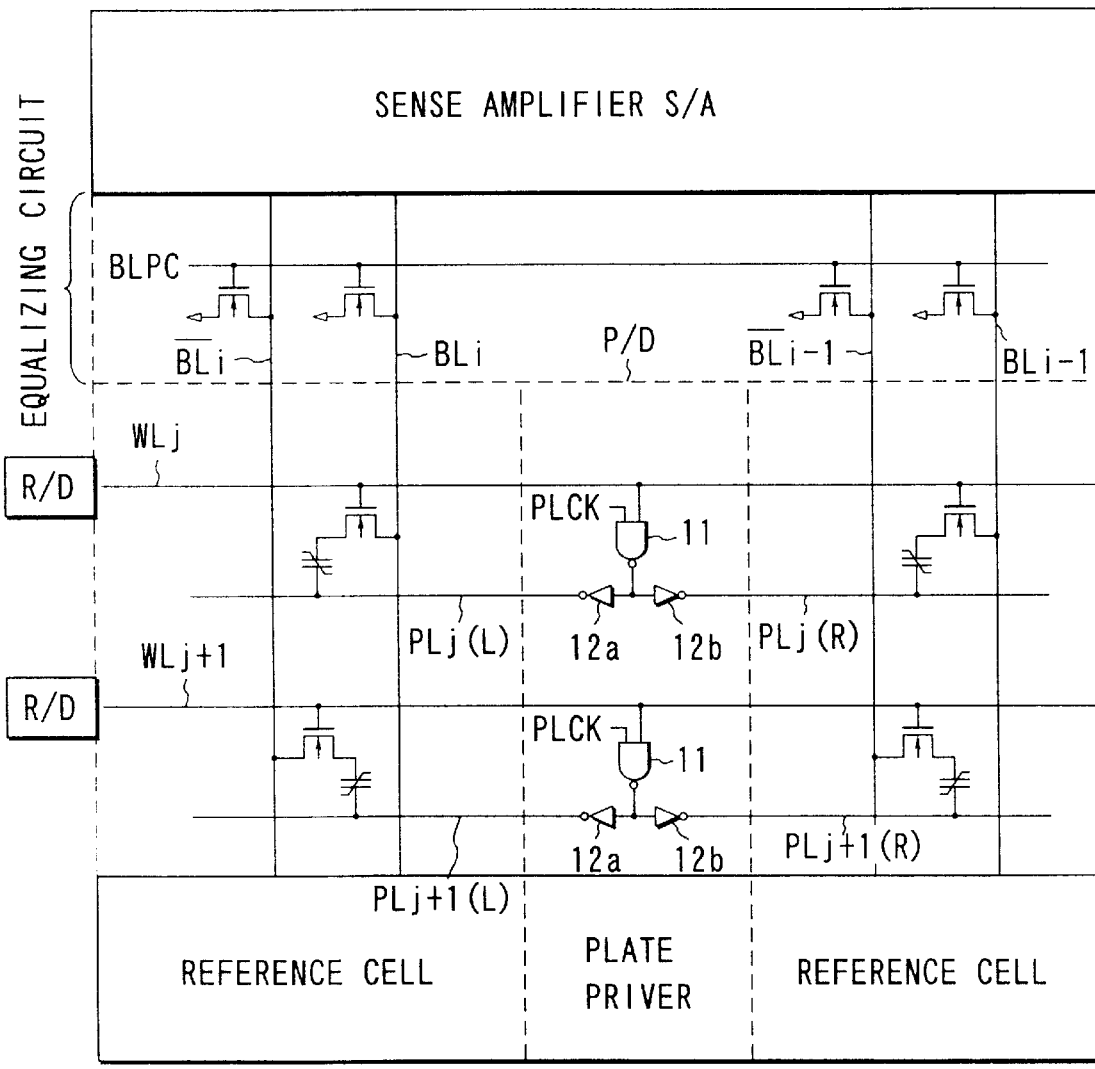
FIG. 5 is a diagram showing a plate driver of FIG. 4.

FIG. 5 shows a circuit arrangement of the plate driver P/D of the memory cell array.

The plate driver P/D is constituted of an AND logic circuit, namely, an NAND circuit 11 and inverter circuits 12a, 12b. The NAND circuit 11 has two input terminals. A potential of a word line WLj is input in one of the two input terminals. A clock signal PLCK is input in the other terminal. The output terminal of the NAND circuit 11 is connected to plate lines PLj(L) and PLj(R) by way of the inverter circuits 12a and 12b.

To describe more specifically, in the plate driver P/D connected to the word line WLj selected, since the word line WLj selected has a high potential ("H" state), the clock signal PLCK ("H" or "L") is supplied to plate lines PLj(L) and PLj(R) by way of the AND logic circuit and further supplied to an end of the ferroelectric capacitor of the memory cell connected to the word line wLj selected.

Furthermore, in the plate driver P/D connected to the word line WLj+1, since the word line WLj+1 not selected has a ground potential ("L" state), the ground potential GND is applied to plate lines PLj+1(L) and PLj+1(R) despite the value of the clock signal PLCK ("H" or "L") and further applied to an end of the ferroelectric capacitor of the memory cell connected to the word line WLj+1 not selected.

Note that the equalizing circuit is responsible for equalizing potentials of all bit line pairs BLi, $\overline{BLi}$ to a certain potential (a ground potential GND, herein) before data are read out to the bit line pair BLi, $\overline{BLi}$.

Figure 6:
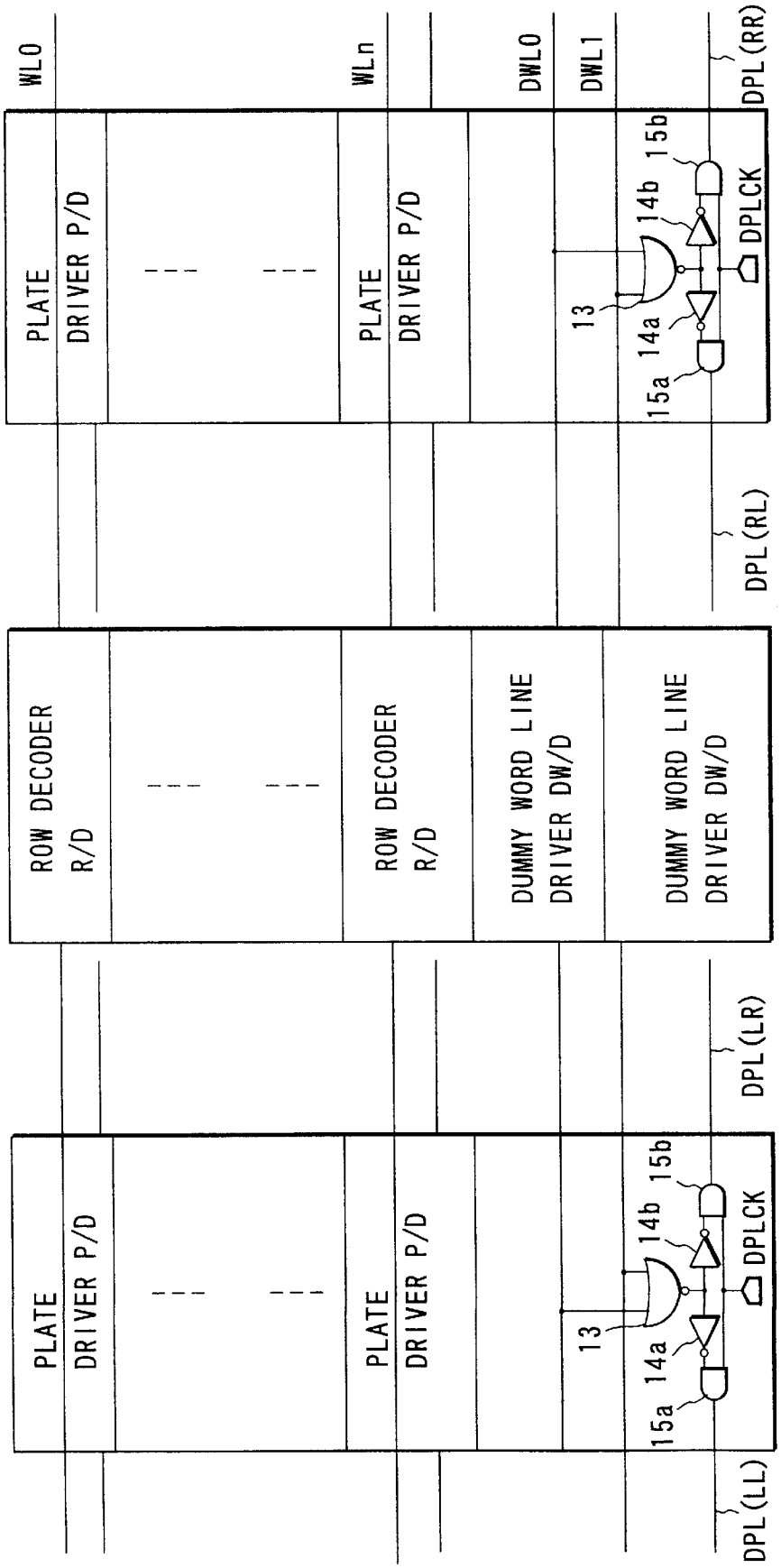
FIG. 6 is a diagram showing a dummy plate driver of FIG. 4.
Figure 7:
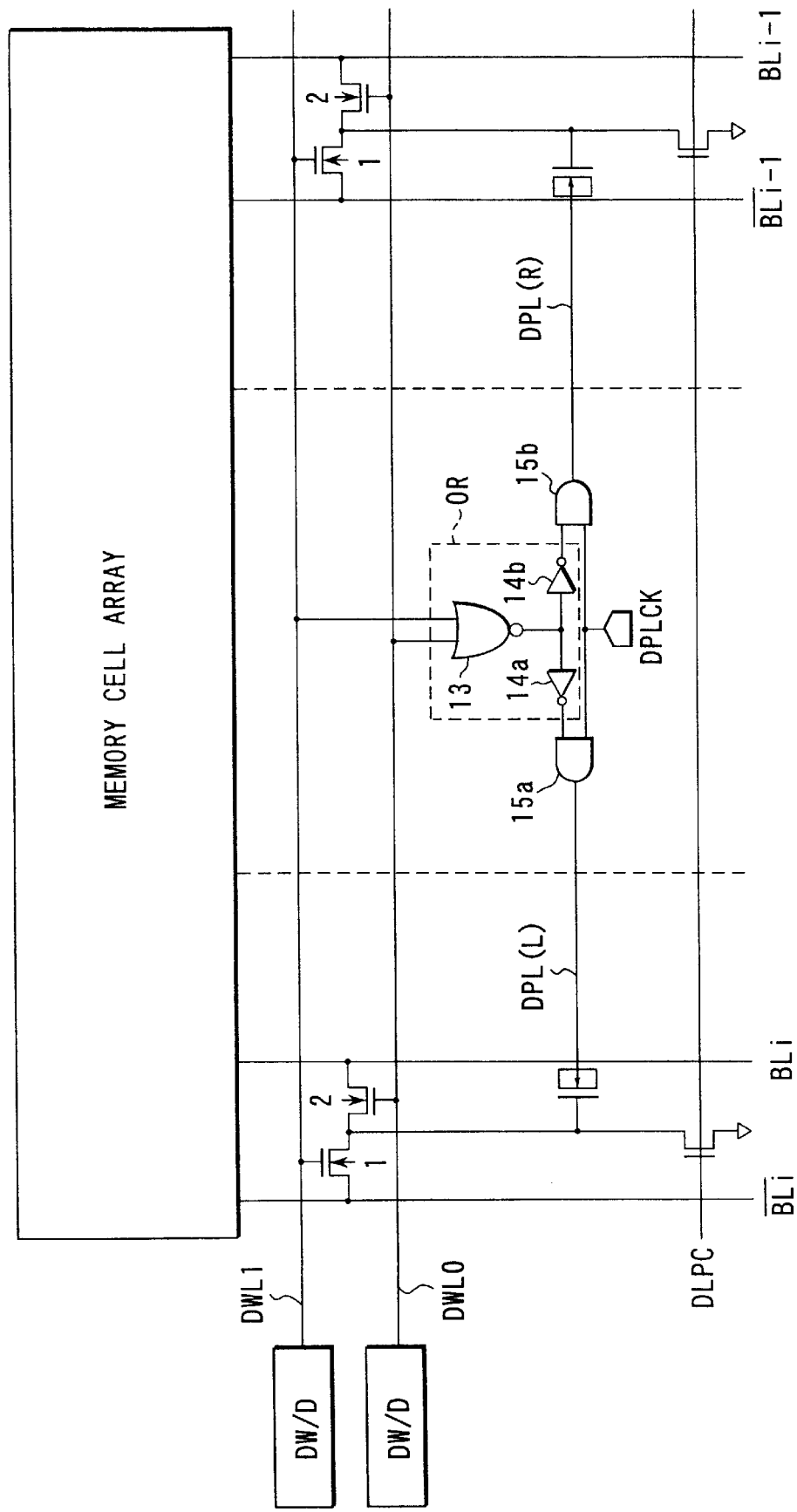
FIG. 7 is a diagram showing the dummy plate driver of FIG. 4.

FIGS. 6 and 7 show structure of the dummy plate driver DP/D of the dummy cell.

The dummy plate driver DP/D is constituted of an OR logic, namely, a NOR circuit 13 and inverter circuits 14a, 14b, and an AND logic (AND circuits 15a, 15b). To the NOR circuit 13, potentials of two dummy word lines DWL0, DWL1, are independently input. The output from the NOR circuit 13 is input in the AND circuit 15a by way of the inverter circuit 14a and simultaneously input in the AND circuit 15b by way of the inverter circuit 14b.

More specifically, potentials of two dummy word lines DWL0 and DWL1 are ORed, and the ORed result is input in the AND circuits 15a and 15b. Therefore, when at least one of two dummy word lines DWL0 and DWL1 has a high potential ("H" state), the high potential ("H" state) is input in an input terminal of one of the AND circuits 15a, 15b. In this case, a dummy plate clock signal DPLCK ("H" or "L") is supplied to the dummy plate line DPL by way of the AND circuits 15a, 15b.

Therefore, if a single dummy capacitor (paraelectric capacitor) is disposed per :single column, that is, per bit line pair BLi, $\overline{BLi}$, it is possible to supply charge (reference potential) to both of the bit line pair BLi, $\overline{BLi}$ by the single dummy capacitor.

Note that the charge of the dummy capacitor (e.g., paraelectric capacitor) is released to a bit line BLi by way of the transfer gate ② when the dummy word line DWL0 is selected, or released to a bit line $\overline{BLi}$ by way of the transfer gate ① when the dummy word line DWL1 is selected.

Figure 8:
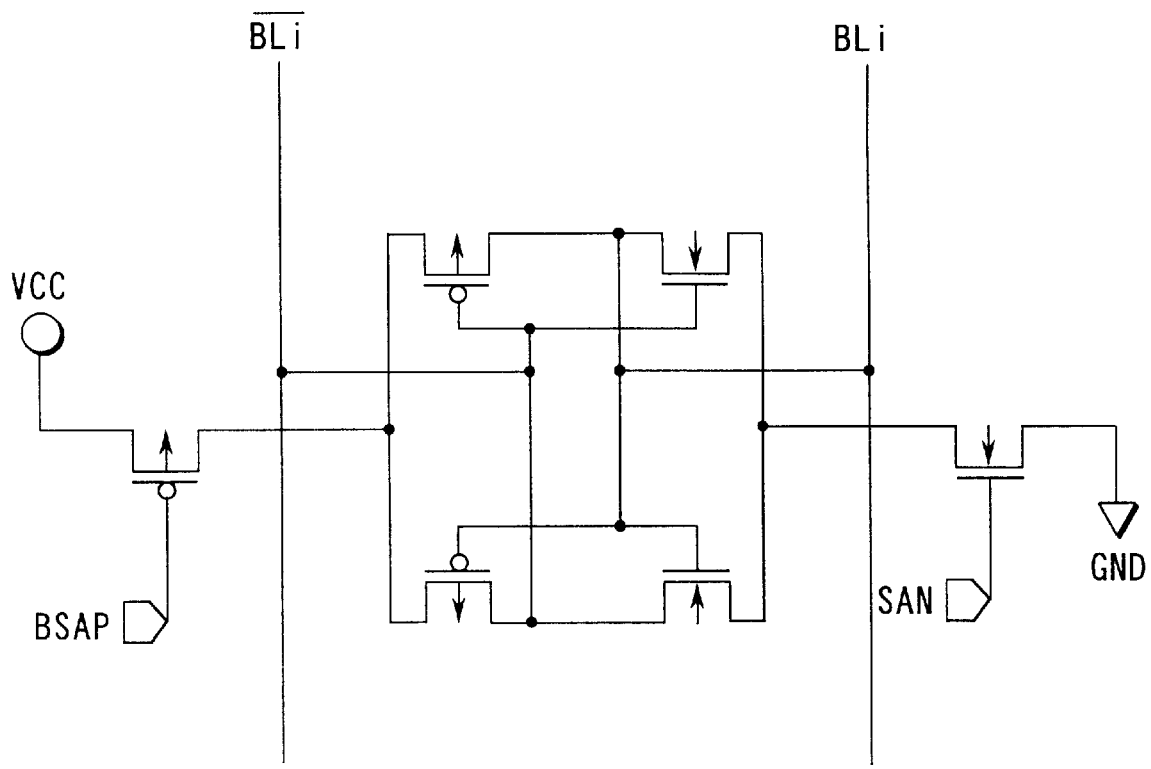
FIG. 8 is a diagram showing a sense amplifier of FIG. 4.

FIG. 8 is an example of a sense amplifier circuit S/A of FIG. 4.

The sense amplifier circuit is provided in every column and connected to a bit line pair BLi, $\overline{BLi}$. When the sense amplifier activation signal SAN is "H" and a sense amplifier activation signal BSAP comes to "L" (since SAN is complementary to BSAP), powers VCC, GND are supplied to the sense amplifier circuit to activate it.

Figure 9:
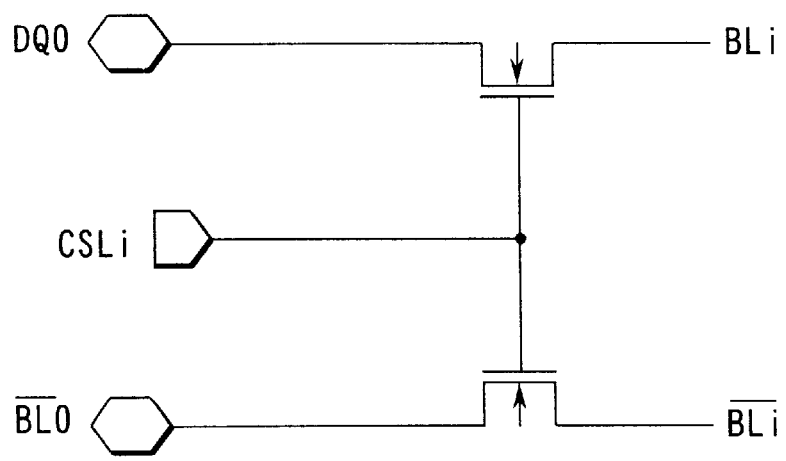
FIG. 9 is a diagram showing a DQ gate for column selection of FIG. 4.

FIG. 9 shows an example of a DQ gate for column selection of FIG. 4.

The DQ gate for column selection is provided in every column and constituted of two N channel MOS transistors connected between the bit line pair BLi, $\overline{BLi}$ and the data line pair DQ0, $\overline{DQ0}$. To the gates of the two N channel MOS transistors, an output signal of a column decoder C/D, namely, a column selection signal CSLi, is input. A single column of a plurality of columns is selected by the column selection signal CSLi. The bit line pair BLi, $\overline{BLi}$ of the selected column are electrically connected to the data line pair DQ0, $\overline{DQ0}$.

Now, how to read out data of the ferroelectric memory will be explained more specifically with reference to a timing chart of FIG. 10.

Figure 10:
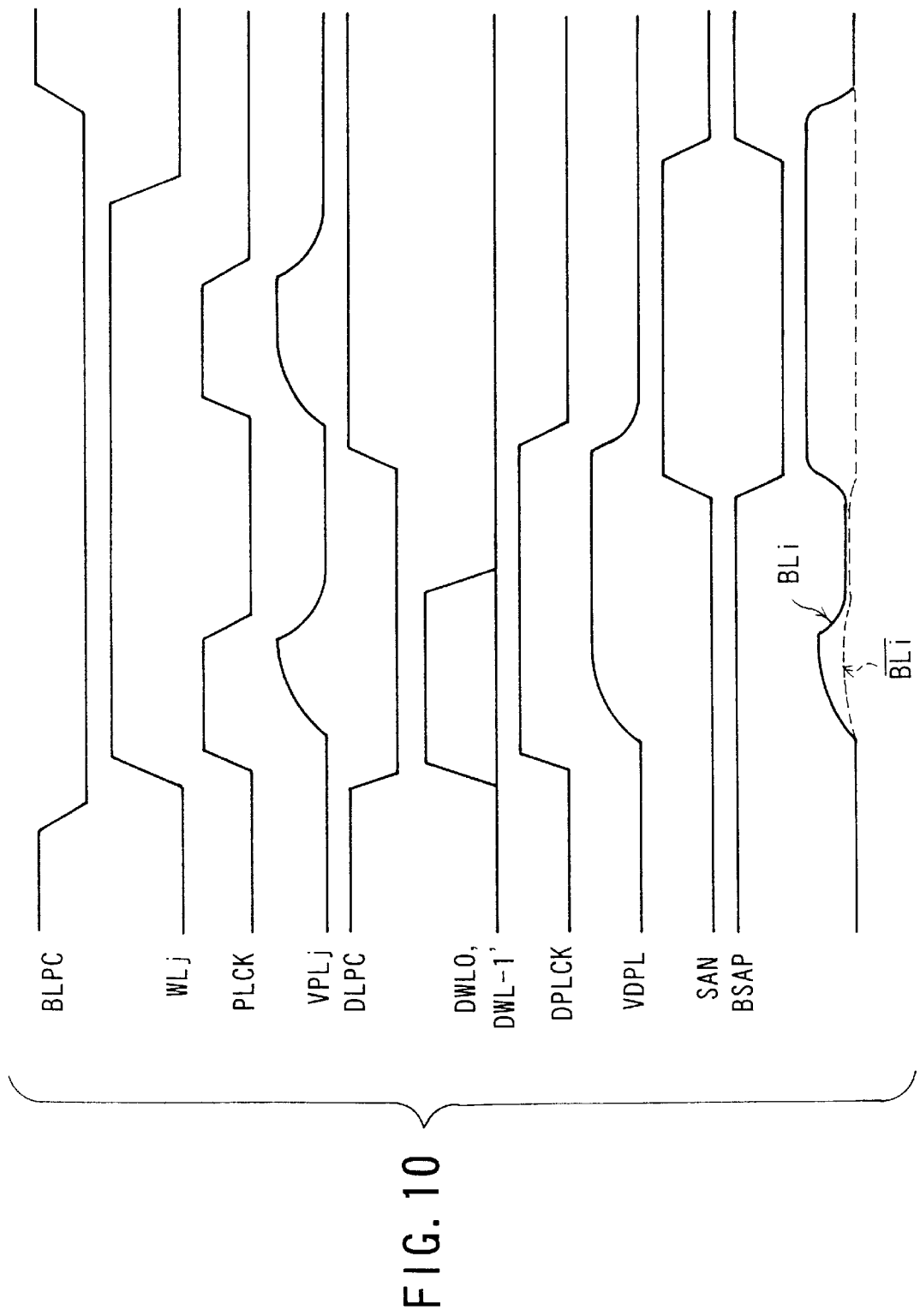
FIG. 10 is a timing chart showing operation of the ferroelectric memory shown in FIGS. 3 to 9.

Reference symbols indicating signals in the timing chart of FIG. 10 correspond to those of signals shown in FIGS. 3 to 9.

In a first place, the timing chart starts with the state in which an equalizing signal BLPC is in the "H" state, in other words, the state in which the N channel MOS transistor of the equalizing circuit. is turned on. All bit line pairs BL0, $\overline{BL0}$ . . . . . . BLi, $\overline{BLi}$ are set at a ground potential GND.

At this time point, a signal DLPC (FIG. 7) goes to the "H" state. Thus, a node at a transfer gate side of the dummy capacitor (e.g., paraelectric capacitor) of the dummy cell is set at the ground potential GND.

Thereafter, the equalizing signal BLPC is set at the "L" state and the N channel MOS transistor of the equalizing circuit is turned off. In this way, the equalize state of all bit line pairs BL0, $\overline{BL0}$ . . . . . . BLi, $\overline{BLi}$ is released. Furthermore, the signal DLPC is also set at the "L" state.

The row decoder R/D selects a single word line WLj based on the row address signal. A high potential (read potential) is supplied to the word line WLj selected and simultaneously, the dummy word line driver DW/D selects either one of two dummy word lines DWL0, DWL1 to supply the high potential (read potential).

In this example, if the word line WLj (j is 0 or an even number and the memory cell connected to the word line should be connected to the bit line BLi) is selected, the dummy word line DWL1 is selected (the reference cell connected to the dummy word line DWL1 should be connected to the bit line $\overline{BLi}$).

Furthermore, if a word line WLj+1 (j is 0 or an even number and the memory cell connected to the word line should be connected to the bit line $\overline{BLi}$) is selected, the dummy word line DWL0 is selected (the reference cell connected to the dummy word line DWL0 should be connected to a bit line BLi).

In the plate driver P/D connected to the word line WLj selected, a potential ("H") of the word line WLj and a clock signal PLCK are ANDed. As a result, a clock signal PLCK ("H") is first supplied to an end of a ferroelectric capacitor of the memory cell connected to the selected word line WLj, namely, a plate line PL, by way of the NAND circuit 11 and inverter circuits 12a and 12b.

At this time, if the data of the memory cell connected to the selected word line WLj is "0", a polarization charge ΔQ0 (shown in a hysteresis curve of FIG. 2) is released to the bit line BLi. Whereas, if the data of the memory cell connected to the selected word line WLj is "1", a polarization charge ΔQ1 (shown in a hysteresis curve of FIG. 2) is released to the bit line BLi.

On the other hand, in the dummy plate driver DP/D connected to the dummy word lines DWL0 and DWL1, in common, the dummy word lines DWL0, DWL1 are ORed and thereafter the ORed result and the clock signal DPLCK are ANDed. As a result, the dummy plate clock signal DPLCK ("H") is applied to an end of a paraelectric capacitor of the reference cell, namely, the dummy plate line DPL.

At this time, the reference potential is supplied from the dummy capacitor (e.g., paraelectric capacitor) to a bit line $\overline{BLi}$ by way of the transfer gate ① connected to the selected dummy word line DWL1.

Thereafter, when the clock signal PLCK goes to the "L" state (while the dummy plate clock signal DPLCK is maintained at the "H" state), a plate potential VPL of the plate line PL within the memory cell array is set at the ground potential GND. Consequently, the potential of the bit line BLi decreases by coupling.

Figure 1:
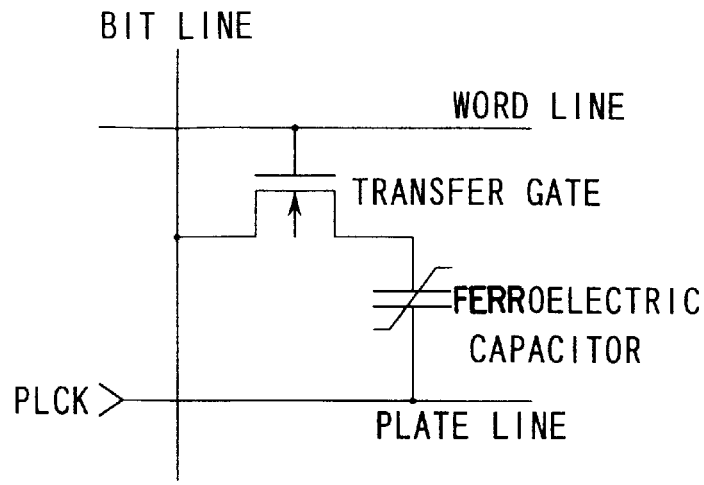
FIG. 1 is a diagram showing a 1T/1C type memory cell of a ferroelectric memory.
Figure 2:
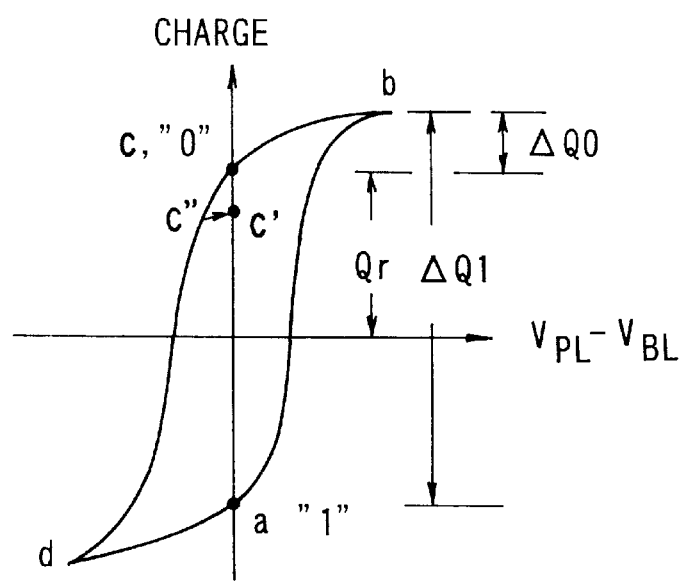
FIG. 2 is a graph showing a hysteresis characteristics of the ferroelectric memory.

When the data of the memory cell connected to the selected word line WLj is 0, the polarization point moves c→b→c in the hysteresis curve of FIG. 2, whereas, when the data of the memory cell connected to the selected word line WLj is "1", the polarization point moves a→b→c in the hysteresis curve of FIG. 2.

Therefore, a difference in charge amount between "0" read-out time and "1" read-out time, that is, ΔQ0−ΔQ1 corresponds to the difference between the point a and the point c.

In this case, a charge amount given from a dummy capacitor (e.g., paraelectric capacitor) of a reference cell to a bit line $\overline{BLi}$ is set at about (ΔQ0−ΔQ1)/2. If the charge is set as mentioned above, it is possible to equalize the margin of "0" read-out charge to that of "1" read-out charge.

The sense amplifier circuit is activated by setting the sense amplifier activation signal SAN at "H" and setting the sense amplifier activation signal BSAP at "L", with the result that the difference in potential of the bit line pair BLi and $\overline{BLi}$ is amplified.

In this step, the polarization point on the hysteresis curve of FIG. 2 is maintained at the point c during the "0" read-out but moves to point d during the "1" read out. Actually, a small amount of charge is supplied to the bit line $\overline{BLi}$ side to which "0" is read out from a P channel MOS transistor of the sense amplifier circuit S/A, in the beginning, with the result that the potential is slightly raised. Due to this phenomenon, the polarization point moves c→c"→c' on the hysteresis curve. Therefore, a second pulse is required for rewrite as described above.

Furthermore, the data (complimentary data amplified by the sense amplifier) of the bit line pair BLi, $\overline{BLi}$ of the selected column are led to a data input/output circuit by way of the data line pair DQ0, $\overline{DQ0}$.

When the dummy plate clock signal DPLCK goes to "L" and the clock signal PLCK returns again to "H", the plate potential VPL of the memory cell is set at a power potential VCC. At this step, the polarization point moves from a point c' to a point b on the hysteresis curve during the "0" read out, and moves from a point d to point a during the "1" read out.

When the read data is "0" and the clock signal PLCK returns to the "L" state, the state of ferroelectric capacitor moves from a polarization point b to the point c in the hysteresis curve of FIG. 2, since the potential of the bit line BLi is set at the ground potential GND by the sense amplifier circuit. As a result, rewrite of "0" data is implemented.

When the read data is "1" and the clock signal PLCK goes to the "L" state, the state of ferroelectric capacitor moves from the point a to the point d, since the potential of the bit line BLi is set at the power potential VCC by the sense amplifier circuit. At this point if a power is turned off, rewrite of "1" data is implemented.

The data read and data rewrite of a memory cell are implemented by the aforementioned operation called a double plate clock system. However, in the ferroelectric memory of the present invention, data can be read out in accordance with a single plate clock system.

In the foregoing, the construction and operation of the ferroelectric memory of the present invention have been roughly explained. The characteristics and effects of the ferroelectric memory are summarized as follows:

First, in the memory cell array consisting of 1T/1C type memory cells, a single dummy capacitor is provided per column, namely, single bit line pairs BLi, $\overline{BLi}$. This means that charge (reference potential) can be selectively supplied to each of the bit line pair BLi, $\overline{BLi}$ from a single dummy capacitor.

When the capacitor of the reference cell (dummy cell) is formed of a paraelectric capacitor such as a MOS capacitor, it is necessary to increase the area of the paraelectric capacitor in accordance with the amount of charge released from the ferroelectric capacitor having a high dielectric constant. According to the present invention, it is sufficient to provide a single dummy capacitor per column. Therefore, the present invention is advantageous for high integration.

Second, since only a single dummy capacitor is disposed per column, it is sufficient that a single dummy plate driver DP/D is provided per two dummy word lines (two dummy word lines DWL0, DWL1).

Accordingly, to function the dummy plate driver DP/D even if either one of two dummy word lines DWL0, DWL1 is selected, potentials of DWL0 and DWL1 are ORed and the ORed result and the clock signal DPLCK are ANDed.

As a result, the number of the dummy plate drivers DP/D can be suppressed to a minimum. Therefore, the present invention can contribute to a reduction of the chip size.

Figure 11:
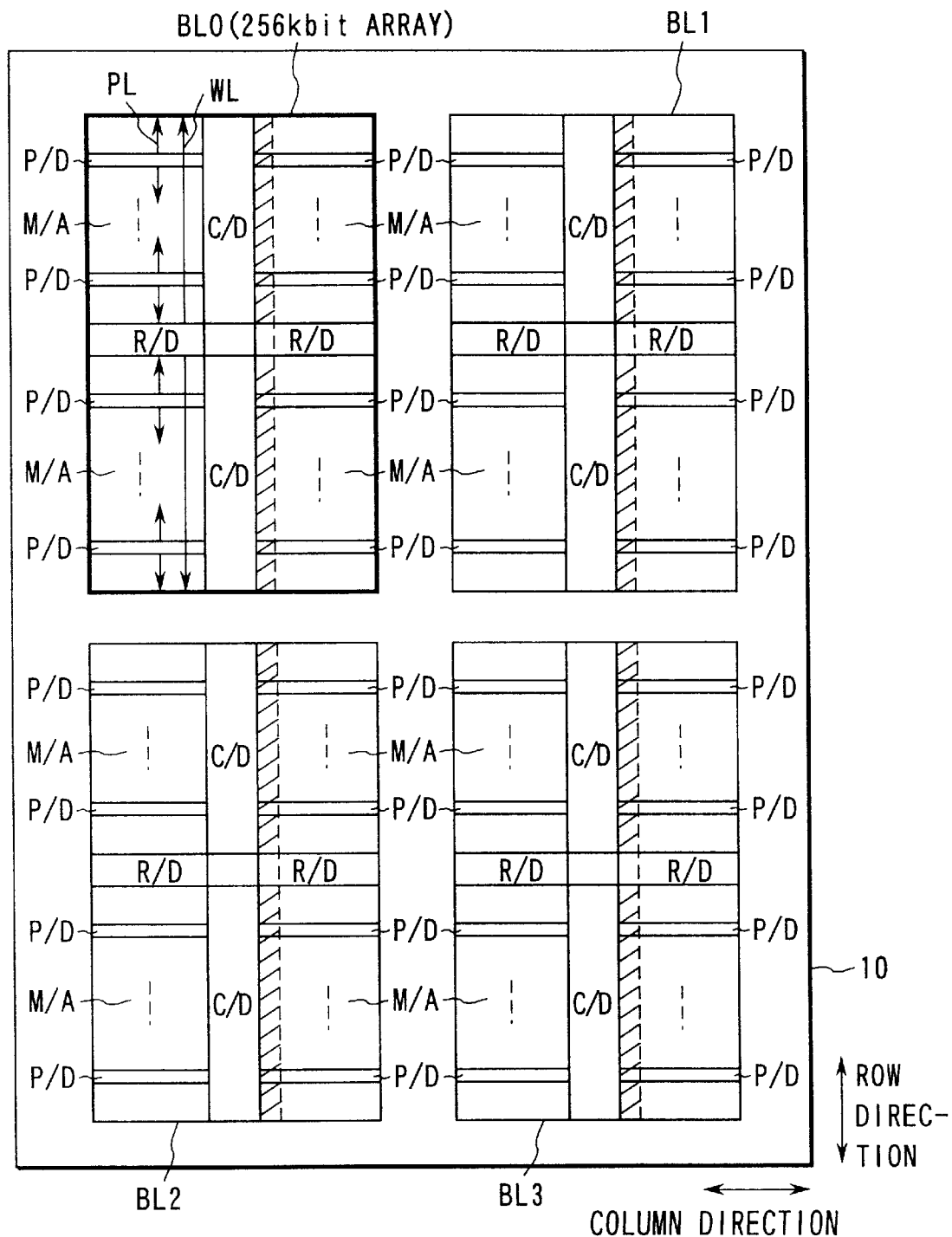
FIG. 11 is a view showing a second example of a floor plan of a ferroelectric memory of the present invention.
Figure 12:
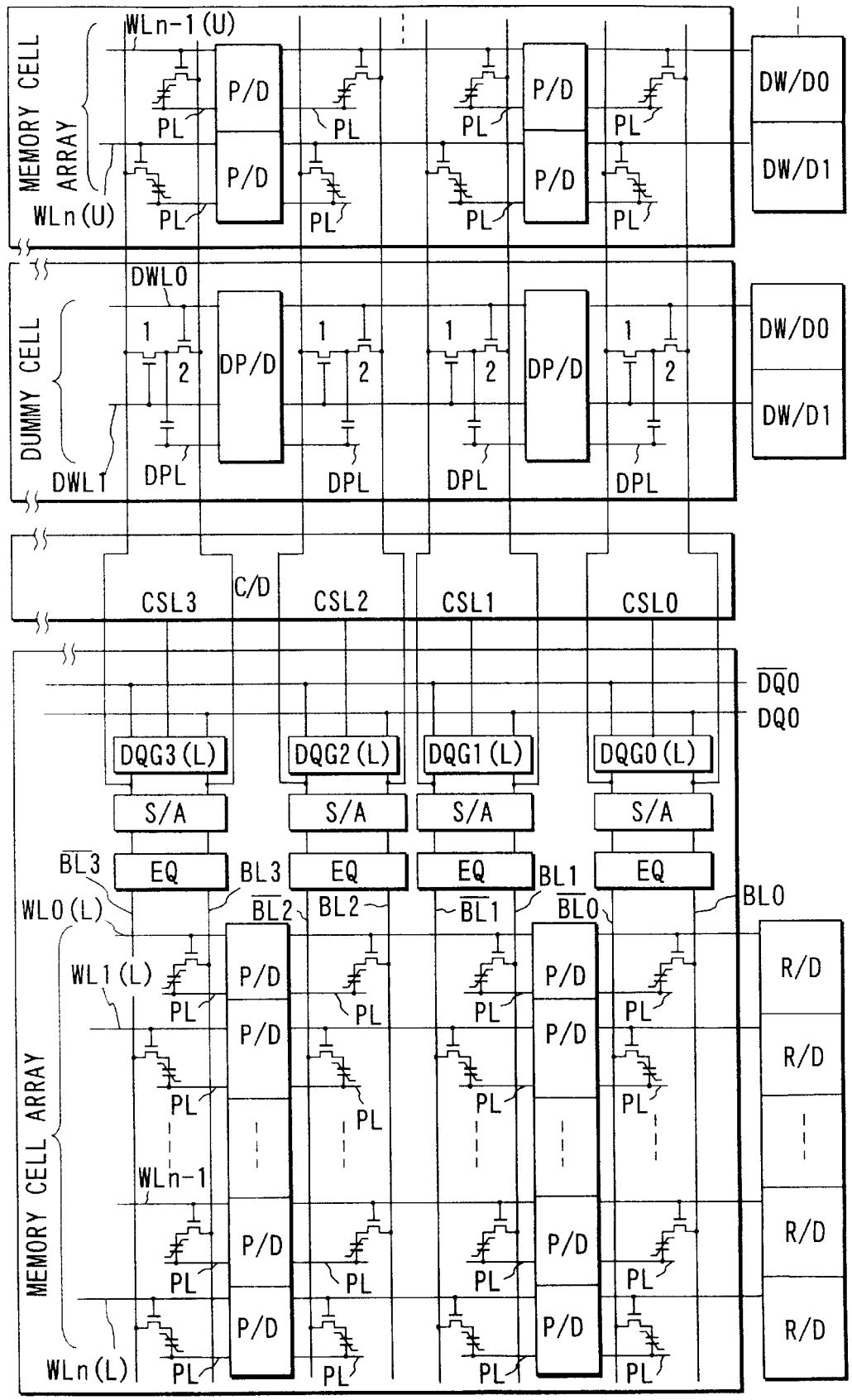
FIG. 12 is a detail view showing a memory cell array of the memory shown in FIG. 11.

FIG. 11 shows a second example of a floor plan of the ferroelectric memory of the present invention. FIG. 12 shows the memory cell array M/A of FIG. 11, in detail.

The feature of the ferroelectric memory resides in that the dummy cell generating a reference potential is arranged only one side of the column decoder C/D. More specifically, in the ferroelectric memory of the first example, the dummy cells are disposed at both sides of the column decoder, that is, next to the memory cell array on both sides of the column decoder C/D. However, in the ferroelectric memory of this example (second example), in order to further improve an integration level, that is, to reduce the chip size smaller than that of the ferroelectric memory of the first example, a single dummy cell array is shared by the memory cell arrays arranged both sides of the column decoder C/D.

Figure 13:
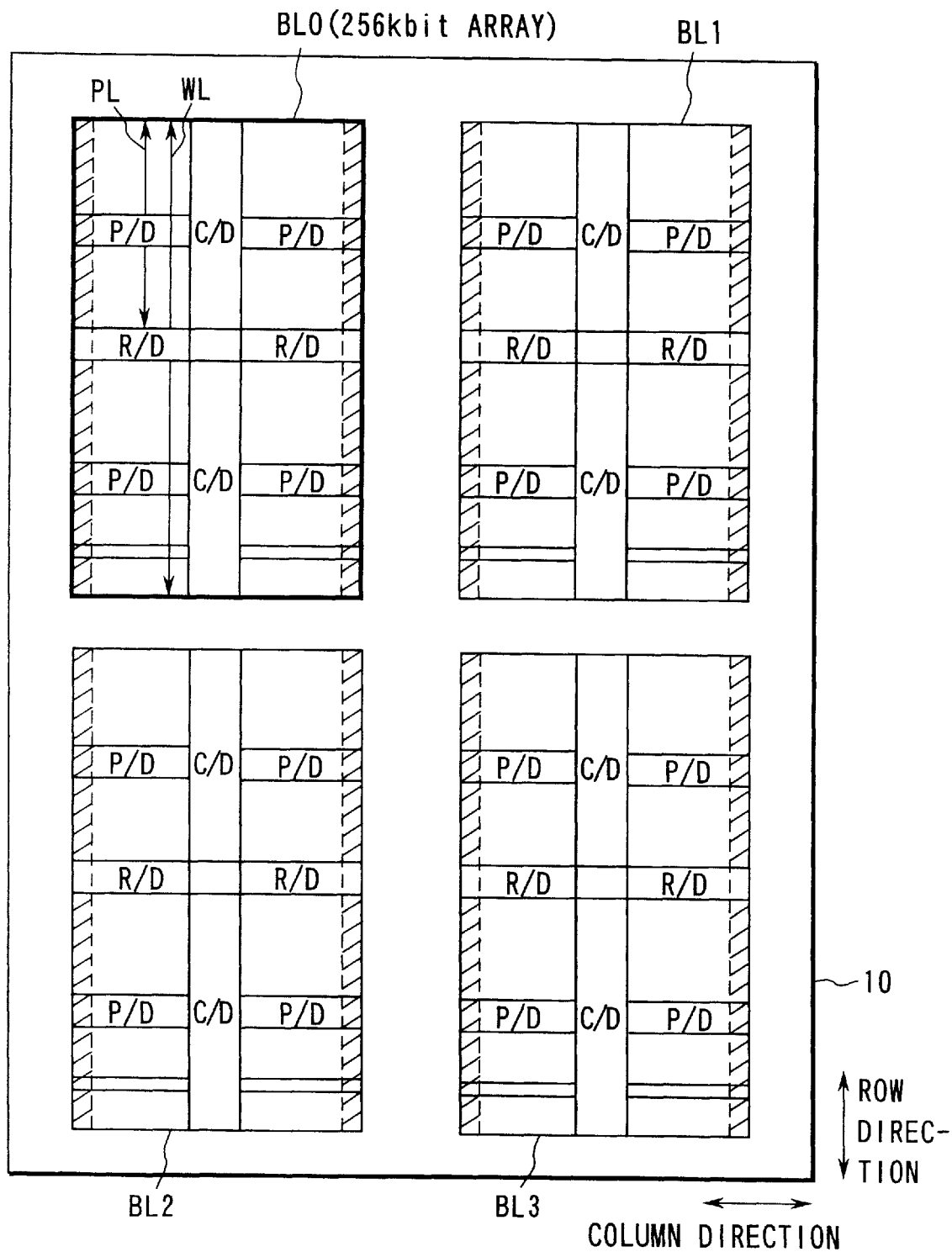
FIG. 13 is a view showing a third example of a floor plan of the ferroelectric memory of the present invention.
Figure 14:
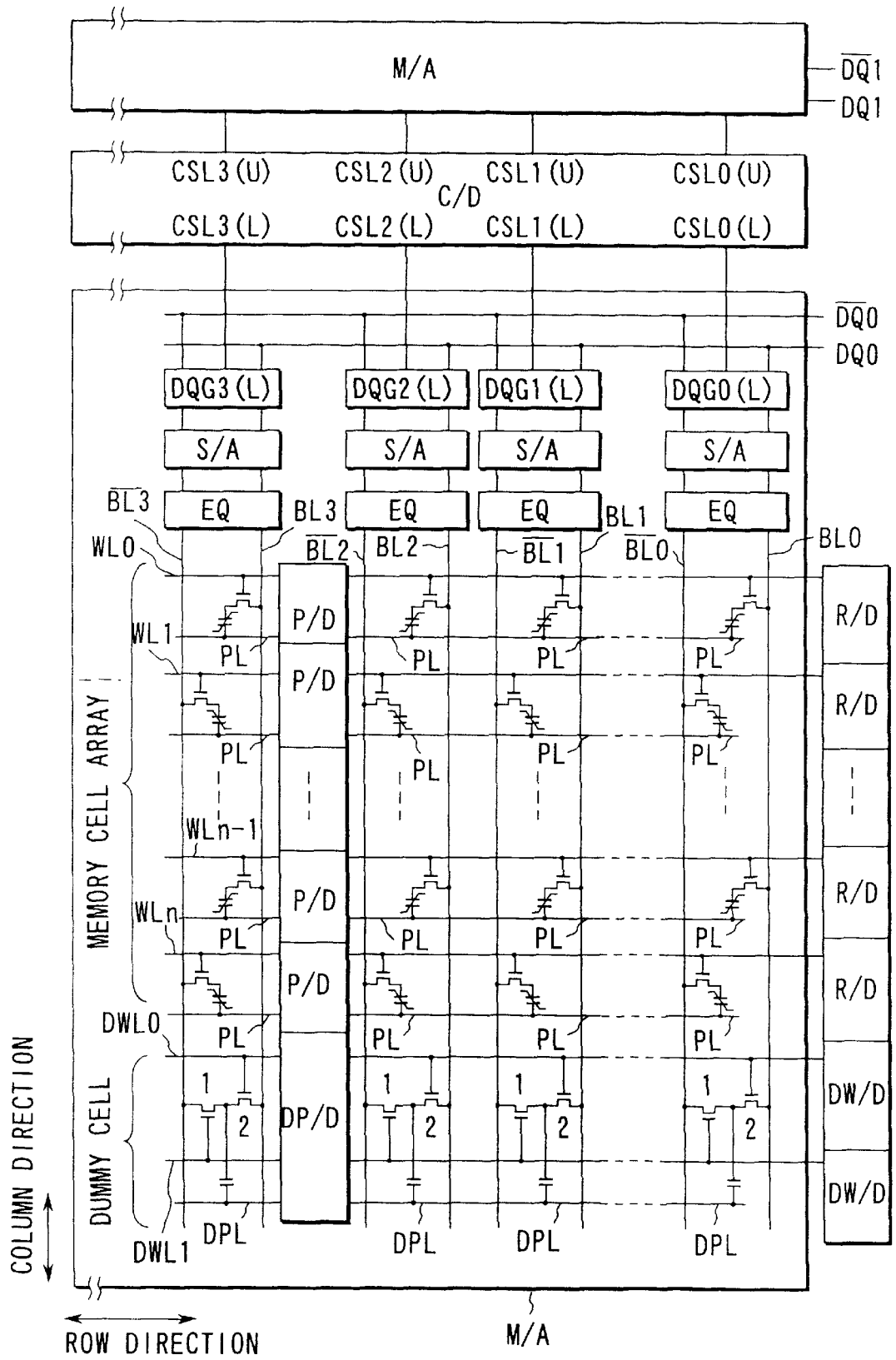
FIG. 14 is a detail view showing a memory cell array of the memory shown in FIG. 13.

FIG. 13 shows a third example of a floor plan of the ferroelectric memory of the present invention. FIG. 14 shows the memory cell array M/A of FIG. 13, in detail.

The feature of the ferroelectric memory of the present invention resides in that only one single plate driver P/D, which supplies a potential to one end of the paraelectric capacitor, is provided on each of both sides of a row decoder R/D (including a dummy word line driver) within each memory cell block, for example, at an almost center of the memory cell array.

In this case, ferroelectric capacitors of all memory cells in the same row are driven by the single plate driver P/D on one side of the row decoder R/D and ferroelectric capacitors of all dummy cells in the same row are driven by the single dummy driver DP/D on one side of the dummy word line driver.

In the ferroelectric memory of this example, it is possible to reduce the numbers of the plate drivers P/D and the dummy plate drivers DP/D compared to the ferroelectric memory of the first example. Therefore, the ferroelectric memory of the present invention is effective for the high integration of a device and the reduction of a chip size.

As explained in the above, according to the ferroelectric memory of the present invention, the dummy cell is provided per column and constituted of a single dummy capacitor and two transfer gates. More specifically, only a single dummy capacitor is provided in the present invention, although two dummy capacitors are provided per bit line pair BLi, $\overline{BLi}$ within the same column in a conventional case. However, the single dummy capacitor is capable of selectively supplying the charge (reference potential) to both bit line pair BLi, $\overline{BLi}$.

Since only a single dummy capacitor is arranged per column in the present invention, a single dummy plate driver DP/D is sufficient to be provided to two dummy word line drivers (two dummy word lines DWL0, DWL1). Accordingly, in order for the dummy plate driver DP/D to function even if either one of the two dummy word lines DWL0, DWL1 is selected, the potentials of the two dummy word lines DWL0, DWL1 are ORed, and then, the ORed result and the clock signal DPLCK are ANDed.

Hence, from a view point of high-integration, the present invention is advantageous to the case where the capacitor of the reference cell is constituted of a paraelectric capacitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
    a memory cell consisting of
        a ferroelectric capacitor having a first end and a second end, and
        a first transistor having a first node, a second node and a gate, and the first node being connected to the first end of the ferroelectric capacitor;
    a word line connected to the gate of the first transistor;
    a plate line connected to the second end of the ferroelectric capacitor;
    a bit line pair consisting of a first bit line and a second bit line, either one of the first bit line and the second bit line being connected to the second node of the first transistor;
    a plate driver for supplying a plate potential to the plate line;
    a dummy cell consisting of
        a dummy capacitor having a first end and a second end,
        a second transistor having a first node, a second node and a gate, the first node being connected to the first end of the dummy capacitor, and
        a third transistor having a first node, a second node and a gate, the first node being connected to the first end of the dummy capacitor;
    a first dummy word line connected to the gate of the second transistor;
    a second dummy word line connected to the gate of the third transistor;
    a dummy plate line connected to the second end of the dummy capacitor; and
    a dummy plate driver for supplying a dummy plate potential to the dummy plate line,
    wherein the second node of the second transistor is connected to the first bit line and the second node of the third transistor is connected to the second bit line.

2. A ferroelectric memory according to claim 1, wherein the dummy plate driver comprises
    means for ORing potentials of the first and second dummy word lines; and
    means for ANDing potentials of an ORed result and potential of a clock signal, an ANDed result being employed as the dummy plate potential.

3. A ferroelectric memory according to claim 1, wherein the plate driver comprises means for ANDing potentials of the word line and the clock signal, an ANDed result being employed as the plate potential.

4. A ferroelectric memory according to claim 1, wherein a distance from a row decoder for selecting the word line to the plate driver is substantially equal to a distance from a dummy word line driver for driving the first or second dummy word line to the dummy plate driver.

5. A ferroelectric memory according to claim 4, wherein the plate drier is arranged next to the dummy plate driver.

6. A ferroelectric memory according to claim 1, wherein, when charge of the ferroelectric capacitor is released to the first bit line, charge of the dummy capacitor is released to the second bit line, and when charge of the ferroelectric capacitor is released to the second bit line, charge of the dummy capacitor is released to the first bit line.

7. A ferroelectric memory according to claim 1, wherein the dummy capacitor is a paraelectric capacitor.

* * * * *